(12) United States Patent
Li

(10) Patent No.: US 7,235,822 B2
(45) Date of Patent: Jun. 26, 2007

(54) TRANSISTOR WITH SILICON AND CARBON LAYER IN THE CHANNEL REGION

(75) Inventor: Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/302,784

(22) Filed: Dec. 14, 2005

(65) Prior Publication Data

US 2006/0097318 A1    May 11, 2006

Related U.S. Application Data

(62) Division of application No. 10/748,995, filed on Dec. 30, 2003, now Pat. No. 7,005,333.

(51) Int. Cl.
*H01L 29/737* (2006.01)
(52) U.S. Cl. .................. 257/190; 257/183; 257/192; 257/E29.188
(58) Field of Classification Search ............... None
See application file for complete search history.

(56) References Cited

U.S. PATENT DOCUMENTS

| | | | |
|---|---|---|---|
| 5,108,935 A | 4/1992 | Rodder | |
| 5,576,226 A | 11/1996 | Hwang | |
| 5,596,218 A | 1/1997 | Soleimani et al. | |
| 5,683,934 A | 11/1997 | Candelaria | |
| 5,714,788 A | 2/1998 | Ngaoaram | |
| 5,872,387 A | 2/1999 | Lyding et al. | |
| 5,986,287 A | 11/1999 | Eberl et al. | |
| 6,051,865 A | 4/2000 | Gardner et al. | |
| 6,060,755 A * | 5/2000 | Ma et al. ............ | 257/410 |
| 6,100,558 A | 8/2000 | Krivokapic et al. | |
| 6,110,784 A | 8/2000 | Gardner et al. | |
| 6,261,889 B1 | 7/2001 | Ono | |
| 6,291,282 B1 * | 9/2001 | Wilk et al. .......... | 438/203 |
| 6,303,450 B1 | 10/2001 | Park et al. | |
| 6,358,806 B1 | 3/2002 | Puchner | |
| 6,403,976 B1 | 6/2002 | Saitoh et al. | |

(Continued)

FOREIGN PATENT DOCUMENTS

EP    0 921 575 A2    6/1999

(Continued)

OTHER PUBLICATIONS

Quiñones et al., "Enhanced Mobility PMOSFET's Using Tensile-Strained Si1-yCy Layers," IEEE Electron Device Letters, IEEE, Jul. 1999, vol. 20, No. 7, p. 338-340.*

(Continued)

*Primary Examiner*—Leonardo Andujar
*Assistant Examiner*—Kevin Quinto
(74) *Attorney, Agent, or Firm*—Slater & Matsil, L.L.P.

(57) ABSTRACT

A transistor and method of manufacturing thereof having stressed material layers formed in the channel to increase the speed and improve performance of the transistor. A layer of silicon and carbon is epitaxially grown in the channel region. A thin semiconductor material may be formed over the layer of silicon and carbon, and a stressed semiconductor layer may be epitaxially grown prior to forming the layer of silicon and carbon.

11 Claims, 3 Drawing Sheets

U.S. PATENT DOCUMENTS

| | | | |
|---|---|---|---|
| 6,472,685 | B2 | 10/2002 | Takagi |
| 6,476,454 | B2 | 11/2002 | Suguro |
| 6,492,216 | B1 | 12/2002 | Yeo et al. |
| 6,498,374 | B1 | 12/2002 | Ohuchi |
| 6,528,851 | B1 | 3/2003 | Yu |
| 6,590,271 | B2 * | 7/2003 | Liu et al. .................. 257/510 |
| 6,621,131 | B2 | 9/2003 | Murthy et al. |
| 6,699,764 | B1 | 3/2004 | Tweet et al. |
| 6,774,409 | B2 | 8/2004 | Baba et al. |
| 6,784,101 | B1 | 8/2004 | Yu et al. |
| 6,815,310 | B2 | 11/2004 | Roberds et al. |
| 6,815,735 | B2 | 11/2004 | Inoue et al. |
| 6,821,868 | B2 | 11/2004 | Cheng et al. |
| 2002/0011628 | A1 | 1/2002 | Takagi |
| 2002/0125502 | A1 * | 9/2002 | Baba et al. ................ 257/200 |
| 2003/0102490 | A1 | 8/2003 | Kubo et al. |
| 2003/0146473 | A1 | 8/2003 | Inoue et al. |
| 2003/0148584 | A1 | 8/2003 | Roberds et al. |
| 2004/0232422 | A1 | 11/2004 | Forbes |
| 2005/0035470 | A1 | 2/2005 | Ko et al. |

FOREIGN PATENT DOCUMENTS

| | | |
|---|---|---|
| EP | 1 020 898 A2 | 7/2000 |

OTHER PUBLICATIONS

Chui, C.O., et al., "Germanium MOS Capacitors Incorporating Ultrathin High-κ Gate Dielectric," IEEE Electron Device Letters, Aug. 2002, pp. 473-475, vol. 23, No. 8, IEEE, Los Alamitos, CA.

Chui, C.O., et al., "A Sub-400° C. Germanium MOSFET Technology with High-κ Dielectric and Metal Gate," 2002, 4 pp., IEEE, Los Alamitos, CA.

"Front End Processes," International Technology Roadmap for Semiconductors, 2002 Update, pp. 45-62, http://member.itrs.net/.

Höck, G., et al., "High Hole Mobility in $Si_{0.17}Ge_{0.63}$ Channel Metal-Oxide- Semiconductor Field-Effect Transistors Grown by Plasma-Enhanced Chemical Vapor Deposition," Applied Physics Letters, Jun. 26, 2000, pp. 3920-3922, vol. 76, No. 26, American Institute of Physics, College Park, MD.

Inumiya, S., et al., "Fabrication of HfSiON Gate Dielectrics by Plasma Oxidation and Nitridation, Optimized for 65nm node Low Power CMOS Applications," 2003, 2 pp., 2003 Symposium on VLSI Technology Digest of Technical Papers.

Jiang, H., et al., "Electrical Properties of GeSi Surface- and Buried-Channel p-MOSFET's Fabricated by Ge Implantation," IEEE Transactions on Electron Devices, Jan. 1996, pp. 97-103, vol. 43, No. 1, IEEE, Los Alamitos, CA.

John, S., et al., "Strained Si n-Channel Metal-Oxide-Semiconductor Transistor on Relaxed $Si_{1-x}Ge_x$ Formed by Ion Implantation of Ge," Applied Physics Letters, Apr. 5, 1999, pp. 2076-2078, vol. 74, No. 14, American Institute of Physics, College Park, MD.

King, A.C., et al., "Surface Proximity Effect on End-of-Range Damage of Low Energy $Ge^+$ Implantation," Ultra Shallow Junctions 2003, Seventh International Workshop on: Fabrication, Characterization, and Modeling of Ultra-Shallow Doping Profiles in Semiconductors, Apr. 27-May 1, 2003, pp. 447-450, Santa Cruz, CA.

Lee, M.L., et al., "Strained Ge Channel p-Type Metal-Oxide-Semiconductor Field-Effect Transistors Grown on $Si_{1-x}G_x$/Si Virtual Substrates," Applied Physics Letters, Nov. 12, 2001, pp. 3344-3346, vol. 79, No. 20, American Institute of Physics, College Park, MD.

Legoues, F.K., et al., "Oxidation Studies of SiGe," Journal of Applied Physics, Feb. 15, 1989, pp. 1724-1728, vol. 65, No. 4, American Institute of Physics, College Park, MD.

Liu, K.C., et al., "A Deep Submicron $Si_{1-x}Ge_x$/Si Vertical PMOSFET Fabricated by Ge Ion Implantation," IEEE Electron Device Letters, Jan. 1998, pp. 13-15, vol. 19, No. 1, IEEE, Los Alamitos, CA.

Nguyen, N.V., et al., "Characterization of the Interface Between $Ge^+$-Implanted Crystalline Silicon and its Thermally Grown Oxide by Spectroscopic Ellipsometry," Journal of Applied Physics, Jan. 15, 1990, pp. 599-603, vol. 67, No. 2, American Institute of Physics, College Park, MD.

Plummer, J.D., et al., "Silicon VLSE Technology: Fundamentals, Practice and Modeling," 2000, p. 453, Prentice Hall, Upper Saddle River, NJ.

Selvakumar, C.R., et al., "SiGe-Channel n-MOSFET by Germanium Implantation," IEEE Electron Device Letters, Aug. 1991, pp. 444-446, vol. 12, No. 8, IEEE, Los Alamitos, CA.

Shang, H., et al., "High Mobility p-Channel Germanium MOSFETs with a Thin Ge Oxynitride Gate Dielectric," 2002, 4 pp., IEEE, Los Alamitos, CA.

Straube, U.N., et al., "Adverse Effect of $Ge^+$ Implantation for Fabrication of SiGe PMOS," Electronics Letters, Dec. 6, 2001, pp. 1549-1550, vol. 37, No. 25.

Wolf, S., et al., "Silicon Processing for the VLSI Era: vol. 1: Process Technology," 2nd Ed., 2000, pp. 336-339, Lattice Press, Sunset Beach, CA.

Zollner, S., et al., "Optical Constants and Ellipsometric Thickness Determination of Strained $Si_{1-x}Ge_x$:C Layers on Si (100) and Related Heterostructures," Journal of Applied Physics, Oct. 1, 2000, pp. 4102-4108, vol. 88, No. 7, American Institute of Physics, College Park, MD.

Quiñones, E., et al., "Enhanced Mobility PMOSFET's Using Tensile-Strained $Si_{1-y}C_y$ Layers," IEEE Electron Device Letters, Jul. 1999, vol. 20, No. 7, pp. 338-340.

"Front End Processes," International Technology Roadmap for Semiconductors, 2003 Edition, pp. 23-25.

Ernst, T., et al., "A New Si:C Epitaxial Channel nMOSFET Architecture with Improved Drivability and Short-Channel Characteristics," Symposium on VLSI Technology Digest of Technical Papers, 2003, 2 pages.

* cited by examiner

TRANSISTOR WITH SILICON AND CARBON LAYER IN THE CHANNEL REGION

This application is a divisional of patent application Ser. No. 10/748,995, entitled "Transistor with Silicon and Carbon Layer in the Channel Region," filed on Dec. 30, 2003 now U.S. Pat. No. 7,005,333, which application is incorporated herein by reference.

TECHNICAL FIELD

The present invention relates generally to semiconductor devices, and more particularly to a method of fabricating a transistor and a structure thereof.

BACKGROUND

Semiconductor devices are used in a variety of electronic applications, such as personal computers, cell phones, digital cameras, and other electronic equipment, as examples. A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

The gate dielectric for MOSFET devices has in the past typically comprised silicon dioxide. However, as devices are scaled down in size, silicon dioxide becomes a problem because of gate leakage current, which can degrade device performance. Therefore, there is a trend in the industry towards the development of the use of high dielectric constant (k) materials for the use of the gate dielectric in MOSFET devices.

High k gate dielectrics development has been identified as one of the grand challenges in the 2003 edition of International Technology Roadmap for Semiconductor (ITRS), which identifies the technological challenges and needs facing the semiconductor industry over the next 15 years. For low power logic (for portable electronic applications, for example), the main issue is low leakage current, which is absolutely necessary in order to extend battery life. Device performance is then maximized according to the low leakage current requirements. Gate leakage current must be controlled in low power applications, as well as sub-threshold leakage, junction leakage, and band-to-band tunneling.

To fully realize the benefits of transistor scaling, the gate oxide thickness needs to be scaled down to less than 2 nm. However, the resulting gate leakage currents make the use of such thin oxides impractical in many device applications where low standby power consumption is required. For this reason, gate oxide dielectric material will eventually be replaced by an alternative dielectric material that has a higher dielectric constant. However, the device performance of using high k dielectric materials suffers from trapped charge in the dielectric layer which deteriorates the mobility, making the drive current lower than in transistors having silicon dioxide gate oxides, and hence reducing the speed and performance of transistors having high k gate dielectric materials.

Therefore, what is needed in the art is a transistor design and fabrication method having a high k gate dielectric material with increased speed and improved performance.

SUMMARY OF THE INVENTION

These and other problems are generally solved or circumvented, and technical advantages are generally achieved, by preferred embodiments of the present invention which comprise a MOS device having a stressed channel, which increases the speed of the MOS device and improves the device performance. A layer of silicon and carbon is epitaxially grown in a channel region of the MOS device. The layer of silicon and carbon may be disposed over an optional epitaxially grown stressed semiconductor layer. An optional thin semiconductor material may be deposited over the layer of silicon and carbon. The layer of silicon and carbon and optional stressed semiconductor layer create a stressed region in the channel of the MOS device, which is advantageous because the electron mobility and hole mobility are improved. The stressed semiconductor layer lowers the interface of the lattice mismatch between the underlying workpiece and the layer of silicon and carbon, which further improves the performance of the MOS device.

In accordance with a preferred embodiment of the present invention, a method of fabricating a transistor includes providing a workpiece, growing a stressed semiconductor layer over the workpiece, growing a first layer of silicon and carbon over the stressed semiconductor layer, and depositing a gate dielectric material over the layer of silicon and carbon. A gate material is deposited over the gate dielectric material, and the gate material and gate dielectric material are patterned to form a gate and a gate dielectric disposed over the layer of silicon and carbon. A source region and a drain region are formed in the layer of silicon and carbon and stressed semiconductor layer, wherein the source region, drain region, gate and gate dielectric comprise a transistor.

In accordance with another preferred embodiment of the present invention, a method of fabricating a transistor includes providing a workpiece, growing a first layer of silicon and carbon over the workpiece, and depositing a gate dielectric material over the layer of silicon and carbon, the gate dielectric comprising a high k material. A gate material is deposited over the gate dielectric material, the gate material comprising a metal, and the gate material and gate dielectric material are patterned to form a gate and a gate dielectric disposed over the layer of silicon and carbon. A source region and a drain region are formed in at least the layer of silicon and carbon, wherein the source region, drain region, gate and gate dielectric comprise a transistor.

In accordance with yet another preferred embodiment of the present invention, a transistor includes a workpiece, a stressed semiconductor layer disposed over the workpiece, and a first layer of silicon and carbon disposed over the stressed semiconductor layer. A gate dielectric is disposed over the layer of silicon and carbon, and a gate is disposed over the gate dielectric. A source region and a drain region are formed in the layer of silicon and carbon and stressed semiconductor layer, wherein the source region, drain region, gate and gate dielectric comprise a transistor.

In accordance with another preferred embodiment of the present invention, a transistor includes a workpiece, a first layer of silicon and carbon disposed over the workpiece, and a gate dielectric disposed over the layer of silicon and carbon, the gate dielectric comprising a high k material. A gate is disposed over the gate dielectric, the gate comprising metal, and a source region and a drain region are formed in at least the layer of silicon and carbon, wherein the source region, drain region, gate and gate dielectric comprise a transistor.

Advantages of preferred embodiments of the present invention include providing a transistor design and manufacturing method thereof wherein the electrical performance of the transistor and electrical parameters are improved. The transistor has increased speed and may be manufactured in smaller dimensions. Epitaxially grown material layers are introduced into the channel region to introduce stress in the crystalline structure, improving the electron and hole mobility. The drive current of the transistor is also increased.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transistor formed on a semiconductor device. The invention may also be applied, however, to MOSFETs, or other transistor devices, and may include PMOS, NMOS, or CMOS devices, as examples. Only one transistor is shown in each of the figures; however, there may be many transistors formed on the semiconductor devices shown.

Figure 1:
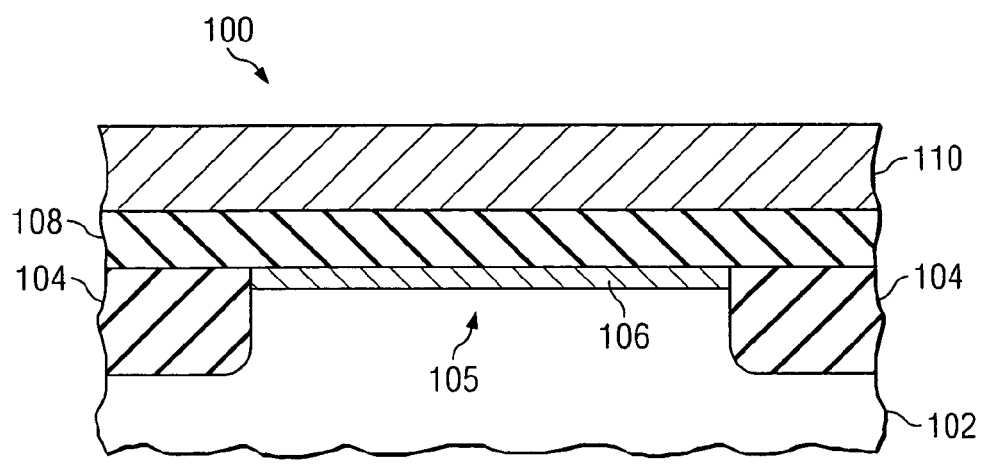
FIGS. 1 and 2 show cross-sectional views of a transistor at various stages of manufacturing in accordance with a preferred embodiment of the present invention, wherein a layer of silicon and carbon is formed over the channel region of the transistor.
Figure 2:
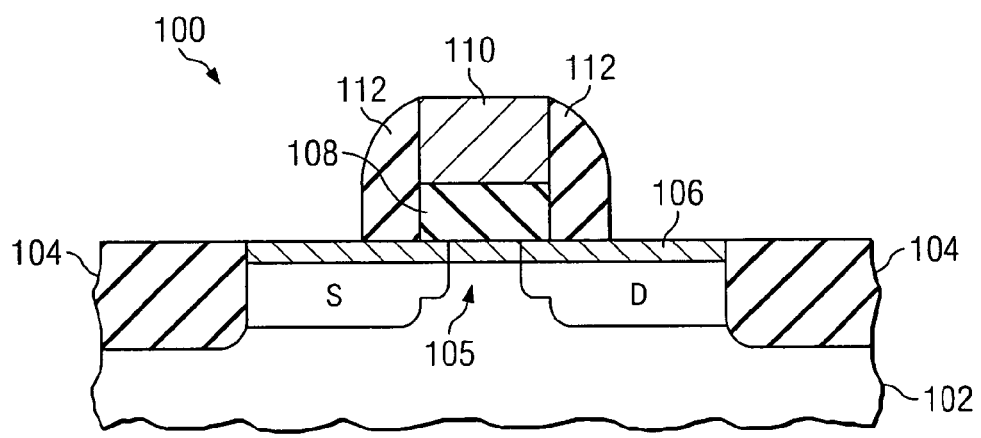

FIGS. 1 and 2 show cross-sectional views of a transistor at various stages of manufacturing in accordance with a preferred embodiment of the present invention, wherein a layer of silicon and carbon is disposed in the channel region of the transistor. To fabricate a transistor 100 in accordance with an embodiment of the present invention, a workpiece 102 is provided. The workpiece 102 may include a semiconductor substrate comprising silicon or other semiconductor materials covered by an insulating layer, for example. The workpiece 102 may also include other active components or circuits formed in the front end of line (FEOL), not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon.

Isolation regions 104 may be formed in various locations on the workpiece 102, as shown. The isolation regions 104 may be disposed on either side of a channel region 105 of a transistor device 100, for example. The isolation regions 104 may be formed by depositing a photoresist over the workpiece 102, not shown. The photoresist may be patterned using lithography techniques, and the photoresist may be used as a mask while the workpiece 102 is etched to form holes or patterns for the isolation regions 104 in a top surface of the workpiece 102. An insulator such as an oxide, for example, may be deposited over the workpiece 102 to fill the patterns, forming isolation regions 104. Alternatively, the isolation regions 104 may be formed by other methods, for example. In accordance with embodiments of the present invention, the isolation regions 104 may be formed either before or after stressed material layer 106 is formed in the channel region 105, to be described further herein.

In accordance with a preferred embodiment of the present invention, a layer of silicon and carbon 106 is formed over the workpiece 102 top surface in the channel region 105, as shown. Preferably, the layer of silicon and carbon 106 is formed by epitaxially growing a layer of material comprising about 90 to 99.5% silicon and about 0.5 to 10% carbon. The layer of silicon and carbon preferably comprises a thickness of about a few tens of Å to about 5 µm. Alternatively, the layer of silicon and carbon 106 may comprise other percentages of silicon and carbon, and may comprise other thicknesses, for example. The layer of silicon and carbon 106 preferably contains a relatively small amount of carbon so that the layer 106 remains conductive. For example, the carbon may comprise interstitial bonds in the silicon crystal material. Preferably, the layer of silicon and carbon 106 is not formed on the isolation regions 104. Because an epitaxial growth method is used to form the layer of silicon and carbon 106, the layer of silicon and carbon 106 is preferably not formed on the insulator material of the isolation regions 104, for example. However, if any material is deposited or grown over the isolation regions 104, a polish process or etch process may be used to remove any silicon and carbon from the top surface of the isolation regions 104.

Regions of the workpiece 102 (not shown) may then be implanted, for a $V_T$ threshold voltage, for example. An anti-punch-through implant may then be performed on portions of the workpiece 102, also not shown. The workpiece 102 may then be exposed to a pre-gate cleaning or treatment comprising an HF chemical etch, as an example, to remove any particulates, contaminates, or native oxide particles disposed on the top surface of the layer of silicon and carbon 106 in the channel region 105, for example.

Next, in accordance with an embodiment of the present invention, a gate dielectric material 108 is deposited over the layer of silicon and carbon 106 and isolation regions 104, as shown in FIG. 1. The gate dielectric material 108 in accordance with one preferred embodiment of the present invention comprises a high k material. The high k material of the gate dielectric material 108 may comprise $HfO_2$, $HfSiO_x$, $ZrO_2$, $ZrSiO_x$, $Ta_2O_5$, or other high k materials, as examples. In another embodiment, however, the gate dielectric material 108 may comprise non-high k dielectric materials, such as $SiO_2$, $Si_3N_4$, or other dielectric materials, as examples.

A gate material 110 is then deposited over the gate dielectric material 108. The gate material 110 preferably comprises a material that is suitable to function as a gate electrode of a transistor device 100. In one preferred embodiment of the present invention, the gate material 110 comprises a metal, such as TiN, HfN, TaN, a fully silicided gate material (FUSI), or other metals, as examples. Alternatively, in another embodiment, the gate material 110 may comprise polysilicon or other semiconductor materials.

The gate material 110 and the gate dielectric material 108 are patterned to form a gate 110 and gate dielectric 108, as shown in FIG. 2. The gate material 110 and gate dielectric material 108 may be patterned using traditional lithography techniques, by depositing a photoresist, patterning the photoresist, and using the photoresist as a mask to pattern the gate material 110 and gate dielectric material 108, not shown, for example. Alternatively, the gate material 110 and gate dielectric material 108 may be directly etched or may be patterned using other methods, for example.

A source region S and drain region D are then formed proximate the channel region 105. More particularly, the source region S and the drain region D are preferably formed in at least the layer of silicon and carbon 106, as shown. Note that in this embodiment, portions of the source region S and drain region D are also formed in a top portion of the workpiece 102. The source region S and drain region D may be formed using an extension implant, which may comprise implanting dopants using a low energy implant at about 200 eV to 1 KeV, for example. A spacer material such as silicon nitride or other insulator, as examples, is deposited over the entire workpiece 102, and then the spacer material is etched using an etch process such as an anisotropic etch, leaving the spacers 112 as shown. Alternatively, the spacers 112 may be more rectangularly shaped and may be patterned using a photoresist as a mask, as an example, not shown. To complete the extension implant, a second dopant implantation process is then performed, preferably using a high energy implantation process. For example, the second implantation process may be at about 5 KeV to 20 KeV. A high temperature anneal may then be performed to drive in and activate the dopant. The high temperature anneal may be performed at about 800° C. to about 1015° C, as examples.

The transistor 100 shown in FIG. 2 is advantageous in that the layer of silicon and carbon 106 in the channel region 105 introduces stress in the channel region 105, which increases the drive current when the transistor 100 is in operation, and also increases the hole and electron mobility of the transistor device 100. This results in a transistor 100 having improved performance and increased speed.

In the embodiment shown in FIGS. 1 and 2, the isolation regions 104 may be formed either before or after the epitaxial growth of the layer of silicon and carbon 106. If the layer of silicon and carbon 106 is grown after the isolation regions 104 are formed, the isolation regions 104 may be back-filled with an oxide or an insulator so that the isolation region 104 top surfaces are coplanar with the top surface of the layer of silicon and carbon 106, and to ensure that the channel region 105 is not elevated higher than the top surface of the isolation regions 104.

Figure 3:
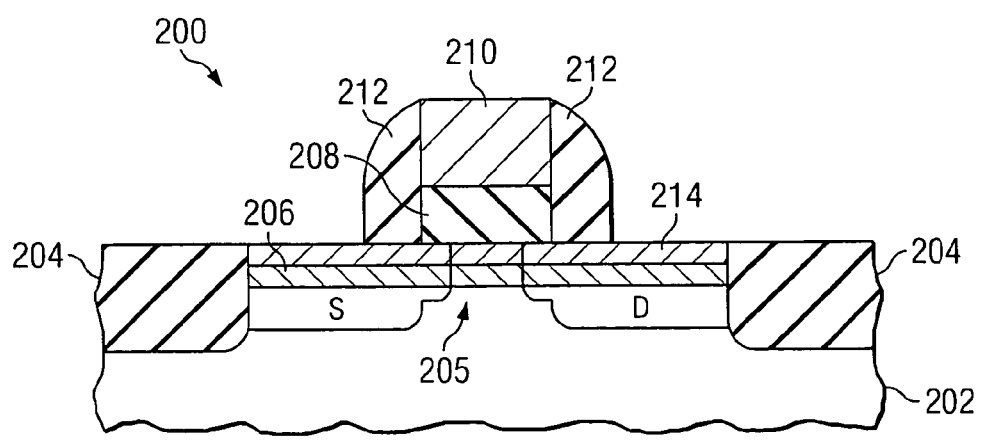
FIG. 3 shows an embodiment of the present invention wherein a thin semiconductor material is formed over the layer of silicon and carbon in the channel region of the transistor.

FIG. 3 shows another embodiment of the present invention, wherein a thin semiconductor material 214 is disposed over a layer of silicon and carbon 206 in a channel region 205 of a transistor 200. Similar reference numbers are designated for the various elements as were used in FIGS. 1 and 2. To avoid repetition, each reference number shown in the diagram is not described in detail herein. Rather, similar materials x02, x04, x05, etc. . . . are preferably used for the material layers shown as were described for FIGS. 1 and 2, where x=1 in FIGS. 1 and 2 and x=2 in FIG. 3. As an example, the preferred and alternative materials listed for gate dielectric material 108 in the description for FIGS. 1 and 2 are preferably also used for gate dielectric material 208 in FIG. 3.

In the transistor 200 shown, a thin semiconductor material 214 is formed over the layer of silicon and carbon 206, before depositing the gate dielectric material 208. The thin semiconductor material 214 preferably comprises about 100 Å or less of a semiconductor material. The thin semiconductor material 214 is preferably epitaxially grown over the layer of silicon and carbon 206, for example. The thin semiconductor material 214 preferably comprises Si in one embodiment. Alternatively, the thin semiconductor 214 may comprise Ge, SiGe, a bilayer of Si/SiGe, or a bilayer of Ge/SiGe.

If the thin semiconductor material 214 comprises a bilayer of Si/SiGe, the bilayer may comprise a first layer of Si and a second layer of SiGe disposed over the first layer of Si. Alternatively, the bilayer may comprise a first layer of SiGe and a second layer of Si disposed over the first layer of SiGe, for example. Likewise, if the thin semiconductor material 214 comprises a bilayer of Ge/SiGe, the bilayer may comprise a first layer of Ge and a second layer of SiGe disposed over the first layer of SiGe, or a first layer of SiGe and a second layer of Ge disposed over the first layer of SiGe.

The transistor 200 shown in FIG. 3 is advantageous in that the thin semiconductor material 214 is disposed between the gate dielectric 208 and the layer of silicon and carbon 206. This moves the interface of the layer of silicon and carbon 206 with the underlying workpiece 202 in the channel region 205 lower into the channel region 205. This is advantageous because the interface of the layer of silicon and carbon 206 and workpiece 202 may comprise mismatched lattices. For example, the lattice distance of the crystalline structure of silicon in the workpiece 202 is different from the lattice distance of silicon including interstitial carbon atoms in the layer of silicon and carbon 206. Therefore, this can create a lattice mismatch and/or defects at the intersection or interface of the layer of silicon and carbon 206 and the workpiece 202. Thus, the transistor 200 is further improved in device performance and speed by the additional thin semiconductor material 214 layer.

In the embodiment shown in FIG. 3, the isolation regions 204 may be formed either before or after the epitaxial growth of the layer of silicon and carbon 206 and the thin semiconductor material 214 layer. If the layer of silicon and carbon 206 and the thin semiconductor material 214 layer are grown after the isolation regions 204 are formed, the isolation regions 204 may be back-filled with oxide or other insulator material so that the isolation region 204 top surfaces are coplanar with the top surface of the thin semiconductor material 214 layer, and to ensure that the channel region 205 is not elevated higher than the top surface of the isolation regions 204.

Figure 4:
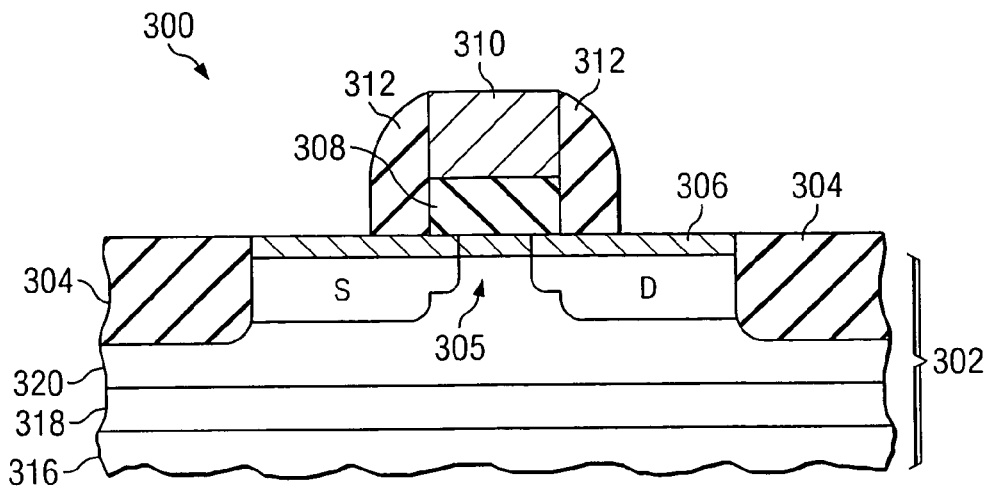
FIGS. 4 and 5 show cross-sectional views of embodiments of the present invention, wherein the embodiments of FIGS. 2 and 3, respectively, are formed on a silicon-on-insulator (SOI) substrate.
Figure 5:
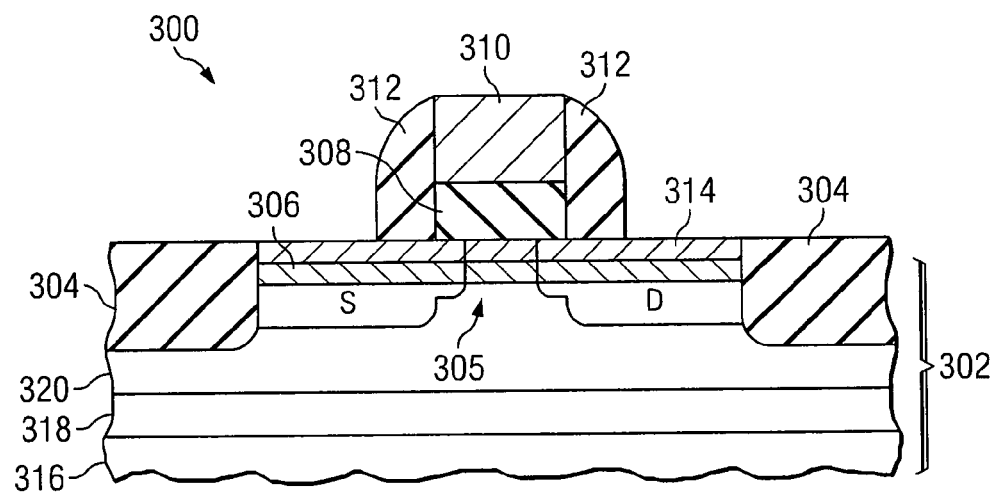

FIGS. 4 and 5 show cross-sectional views of embodiments of the present invention, wherein the embodiments described with reference to FIGS. 1–2 and 3, respectively, are shown formed on a silicon-on-insulator (SOI) substrate or wafer 302. Again, like reference numerals are used as were used and described for the various elements in FIGS. 1 through 3, and to avoid repetition, each reference number shown in the diagram is not described again in detail herein. Rather, similar materials x02, x04, x05, etc. . . . are preferably used for the material layers shown as were described for FIGS. 1–3, where x=1 in FIGS. 1 and 2, x=2 in FIG. 3, and x=3 in FIGS. 4 and 5.

In the embodiments shown in FIGS. 4 and 5, the workpiece 302 preferably comprises a SOI substrate 302. The SOI substrate 302 comprises a thick silicon or other semiconductor material portion 316 that may comprise a thickness of about 500 µm, for example. A buried $SiO_2$ layer 318 is formed over the thick silicon layer region 316. The $SiO_2$ layer 318 may comprise a thickness of about 1000 Å, for example. A thin silicon layer 320 is formed over the buried $SiO_2$ layer 318. The thin silicon layer 320 may comprise a thickness of about 500 Å or less, for example. SOI substrates 302 are advantageous in that leakage current from the source to the substrate is prevented and parasitic capacitance of the transistor 300 is reduced, further increasing the speed of the transistor 300 and reducing the power consumption.

In FIG. 4, a transistor 300 includes a layer of silicon and carbon 306 grown over the top thin silicon layer 320 of the SOI substrate 302 in the channel region 305. In FIG. 5, a transistor 300 further includes a thin semiconductor layer 314 grown over the layer of silicon and carbon 306 in the channel region 305. Again, in these embodiments, the isolation regions 304 may be formed either before or after the epitaxial growth of the layer of silicon and carbon 306 or the thin semiconductor material 314 layer. If the layer of silicon and carbon 306 and/or the thin semiconductor material 314 layer are grown after the isolation regions 304 are formed, the isolation regions 304 may be back-filled with oxide or other insulator material so that the isolation region 304 top surfaces are coplanar with the top surface of the thin semiconductor material 314 layer or layer of silicon and carbon 306, and to ensure that the channel region 305 is not elevated higher than the top surface of the isolation regions 304.

Figure 6:
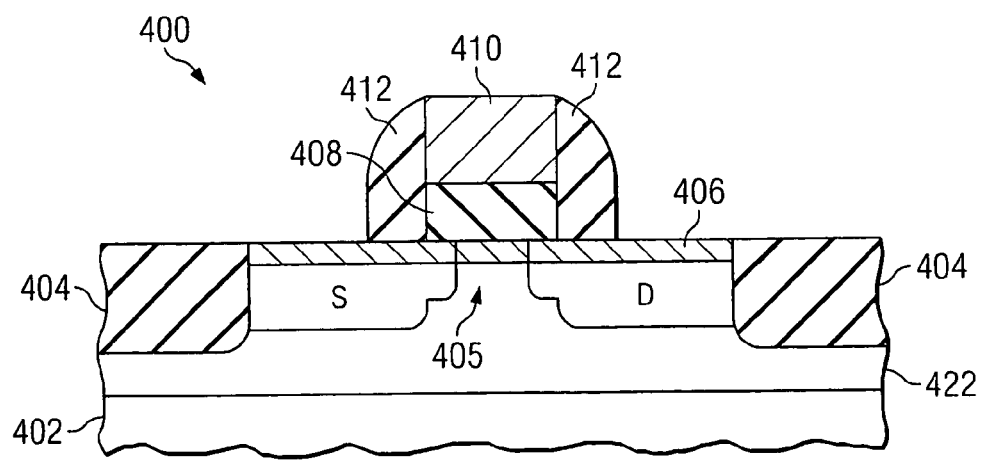
FIGS. 6 and 7 show the embodiments of FIGS. 2 and 3, respectively, wherein a stressed semiconductor layer is formed over a workpiece before the first layer of silicon and carbon is formed.
Figure 7:
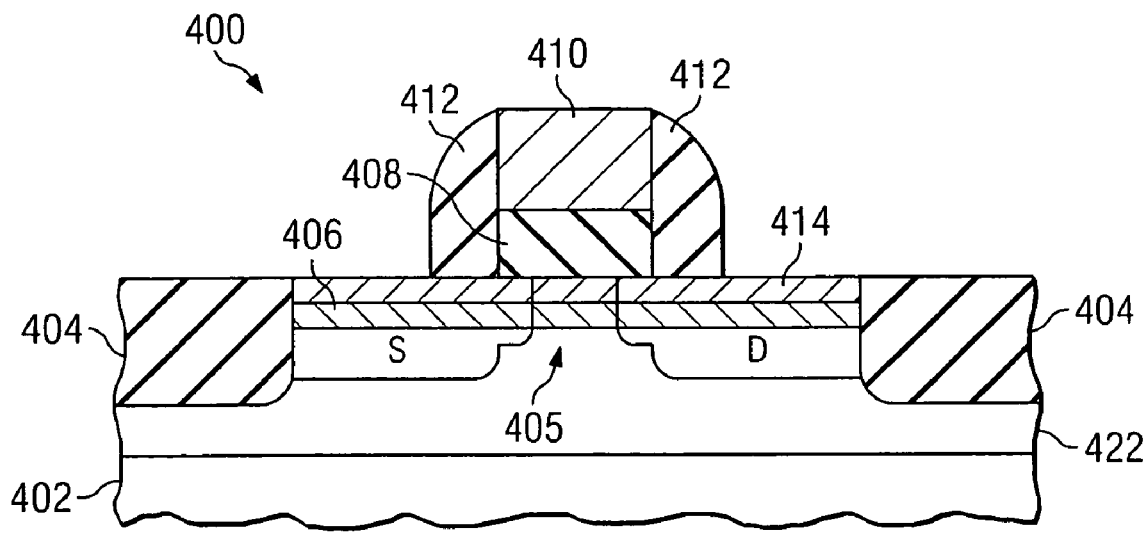

FIGS. 6 and 7 show the embodiments of FIGS. 2 and 3, respectively, wherein a stressed semiconductor layer 422 is epitaxially grown over a workpiece 402 before the layer of silicon and carbon 406 is formed. Again, like reference numerals are used as were used in the previously described figures. In these embodiments, a stressed semiconductor layer 422 is epitaxially grown over the workpiece 402 before growing the layer of silicon and carbon 406. The source regions S and drain regions D are then formed in the layer of silicon and carbon 406 and stressed semiconductor layer 422 in FIG. 6, and also in the optional thin semiconductor material 414 shown in FIG. 7. In these embodiments, the stressed semiconductor layer 422 preferably comprises a thickness of about 100 Å to 5 µm. The stressed semiconductor layer 422 preferably comprises in one embodiment a second layer of silicon and carbon, comprising a similar material as the layer of silicon and carbon 406. In this embodiment, preferably the stressed semiconductor layer 422 comprises a greater thickness than the layer of silicon and carbon 406. Preferably, the stressed semiconductor layer 422 comprises a concentration of carbon that is less than the concentration of the layer of silicon and carbon 406. For example, the stressed semiconductor layer 422 preferably comprises a carbon concentration of about 2–3% or less.

In another embodiment, the stressed semiconductor layer 422 preferably comprises a layer of silicon and germanium or a layer of silicon, carbon, and germanium. Introducing germanium in the stressed semiconductor layer 422 is advantageous because the lattice distance of the silicon and germanium crystalline structure (or silicon, carbon, and germanium) is different than the lattice distance of the layer of silicon and carbon 406, which further increases the hole mobility of the transistor 400. In this embodiment, the germanium concentration of the stressed semiconductor layer 422 is preferably about 25%, and may alternatively comprise about 15 to 45%, and the carbon concentration is preferably about 2–3% or less, as examples.

Figure 8:
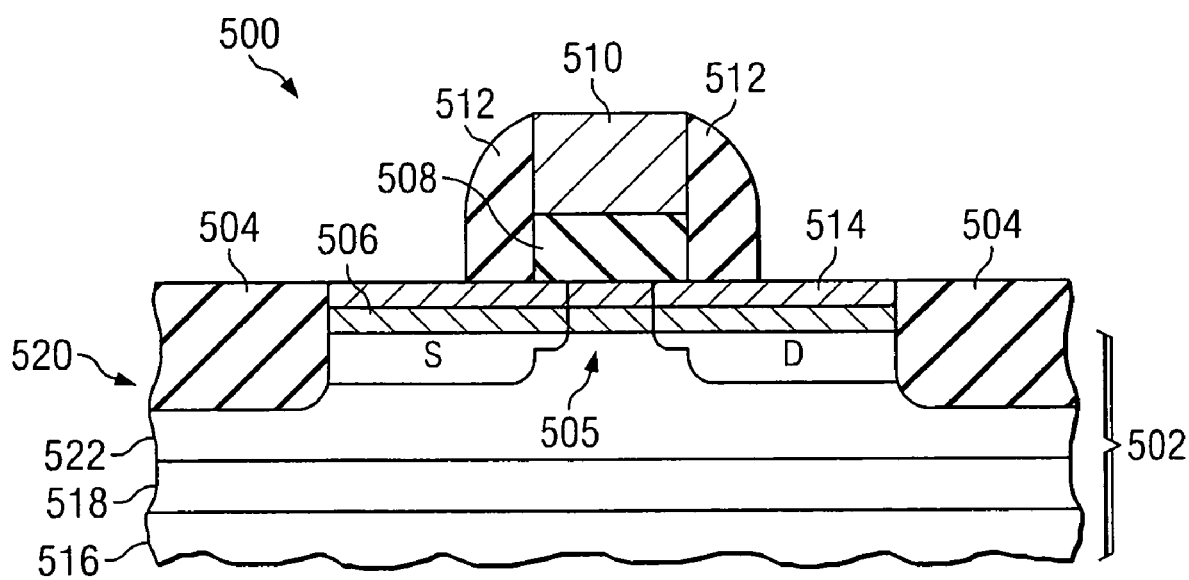
FIG. 8 shows an embodiment of the present invention that includes a stressed semiconductor layer formed beneath the layer of silicon and carbon and thin semiconductor layer, formed on a SOI substrate.

FIG. 8 shows an embodiment of the present invention, which includes a stressed semiconductor layer 522 disposed beneath the layer of silicon and carbon 506 and optional thin semiconductor layer 514, formed on a SOI substrate 502. In this embodiment, a thin semiconductor material 514, a layer of silicon and carbon 506, and a stressed semiconductor layer 522 are formed in the channel region 505 of a transistor 500. The workpiece 502 comprises an SOI substrate 502 having a silicon region 516, a buried $SiO_2$ layer 518, and a thin silicon layer 520 formed over the buried $SiO_2$ layer 518. Note that in this embodiment, preferably, the isolation regions 504 are formed after at least the epitaxial growth of the stressed semiconductor layer 522. Although shown in FIG. 8, the thin semiconductor material 514 is optional and may not be disposed between the layer of silicon and carbon 506 and the gate dielectric 508, (not shown).

Note that in each embodiment shown in the figures, a layer of epitaxial Si may be disposed between the layer of silicon and carbon 106, 206, 306, 406, 506 and underlying layers 102, 202, 320, 422, and 522, respectively (not shown). The epitaxial Si layers are thin and preferably comprise about 50 Å or less of material, as an example. The epitaxial thin Si layers improve the growth of the subsequently-formed epitaxial layers 106, 206, 306, 406, 506, for example.

Advantages of embodiments of the invention include providing a transistor 100, 200, 300, 400, 500 having increased speed and improved electrical characteristics. The transistor 100, 200, 300, 400, 500 has increased drive current, lower power consumption, and increased hole and electron mobility.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor, comprising:
   a workpiece;
   a stressed layer selected from the group of semiconductor material consisting of silicon and silicon with carbon disposed over the workpiece and wherein the amount of carbon in said silicon and carbon layer is less than a first amount;
   a first layer of silicon and carbon disposed directly on the stressed layer wherein the amount of carbon in said first layer is said first amount;
   a gate dielectric disposed over said first layer of silicon and carbon;
   a gate disposed over the gate dielectric; and
   a source region and a drain region formed in the layer of silicon and carbon and stressed semiconductor layer.

2. The transistor according to claim 1, wherein the layer of silicon and carbon comprises an epitaxially grown layer comprising about 90 to 99.5% silicon and about 0.5 to 10% carbon having a thickness of about a few tens of Å to about 5 μm.

3. The transistor according to claim 1, wherein the stressed semiconductor layer comprises an epitaxially grown second layer of silicon and carbon and wherein the stressed semiconductor layer comprises a thickness of about 100 Å to 5 μm.

4. The transistor according to claim 1, wherein the gate dielectric comprises a high k dielectric material, and wherein the gate comprises a metal.

5. The transistor according to claim 1, further comprising a thin semiconductor material disposed directly on the first layer of silicon and carbon and said gate dielectric.

6. The transistor according to claim 5, wherein the thin semiconductor material comprises about 100 Å or less of Si, Ge, SiGe, a bilayer of Si/SiGe, or a bilayer of Ge/SiGe.

7. The transistor according to claim 5, wherein the workpiece comprises a silicon-on-insulator (SQI) wafer.

8. The transistor according to claim 1, wherein the stressed semiconductor layer comprises an epitaxially grown semiconductor layer.

9. The transistor according to claim 8, wherein the stressed semiconductor layer has a thickness of about 100 Å to 5 μm.

10. The transistor according to claim 1, further comprising a thin semiconductor material disposed over the first layer of silicon and carbon.

11. The transistor according to claim 10, wherein the thin semiconductor material comprises about 100 Å or less of Si, Ge, SiGe, a bilayer of Si/SiGe, or a bilayer of Ge/SiGe.

* * * * *